United States Patent
Choi et al.

(10) Patent No.: US 8,376,209 B2
(45) Date of Patent: Feb. 19, 2013

(54) NON-DESTRUCTIVE THERMAL CONDUCTIVITY DETECTION OF SOLDER VOIDS

(75) Inventors: Jae Choi, Westminster, CO (US); Mark D. Woolley, Broomfield, CO (US)

(73) Assignee: Avaya Inc., Basking Ridge, NJ (US)

( * ) Notice: Subject to any disclaimer, the term of this patent is extended or adjusted under 35 U.S.C. 154(b) by 0 days.

(21) Appl. No.: 12/779,848

(22) Filed: May 13, 2010

(65) Prior Publication Data

US 2011/0278455 A1 Nov. 17, 2011

(51) Int. Cl.
*B23K 31/12* (2006.01)
*G01N 25/00* (2006.01)
*G01N 25/72* (2006.01)

(52) U.S. Cl. ............ 228/104; 228/102; 228/103; 374/5; 374/120; 374/124; 73/432.1

(58) Field of Classification Search .................. 228/102, 228/103, 104; 374/5, 124; 72/432.1
See application file for complete search history.

(56) References Cited

U.S. PATENT DOCUMENTS

| 5,250,809 | A | * | 10/1993 | Nakata et al. ................. 250/330 |
| 5,905,299 | A | | 5/1999 | Lecap |
| 6,111,424 | A | * | 8/2000 | Bosacchi ................. 324/750.11 |
| 6,840,666 | B2 | * | 1/2005 | Enachescu et al. ............... 374/5 |
| 6,840,667 | B2 | * | 1/2005 | Schlagheck et al. ............. 374/5 |
| 7,845,849 | B1 | * | 12/2010 | Choi et al. .................... 374/120 |

* cited by examiner

*Primary Examiner* — Devang R Patel
(74) *Attorney, Agent, or Firm* — Sheridan Ross P.C.

(57) ABSTRACT

Systems and methods can produce thermal images of the mounting of a thermally-enhanced integrated circuit (IC) upon a circuit board. The system includes a thermal imaging camera that is operable to image the thermal dissipation and/or conduction through the heat sink into a mounting pad on the substrate. In testing the thermally-enhanced IC, the substrate or IC is connected to a power source, and the IC is operated such that the IC begins to generate heat. As the heat is conducted or dissipated through the heat sink into the mounting pad, a thermal imaging camera can detect the heat conduction and/or dissipation through the heat sink into the substrate. If there are voids or other types of failures in the mounting of the IC, the thermal imaging camera can detect cooler or colder spots in the image.

7 Claims, 11 Drawing Sheets

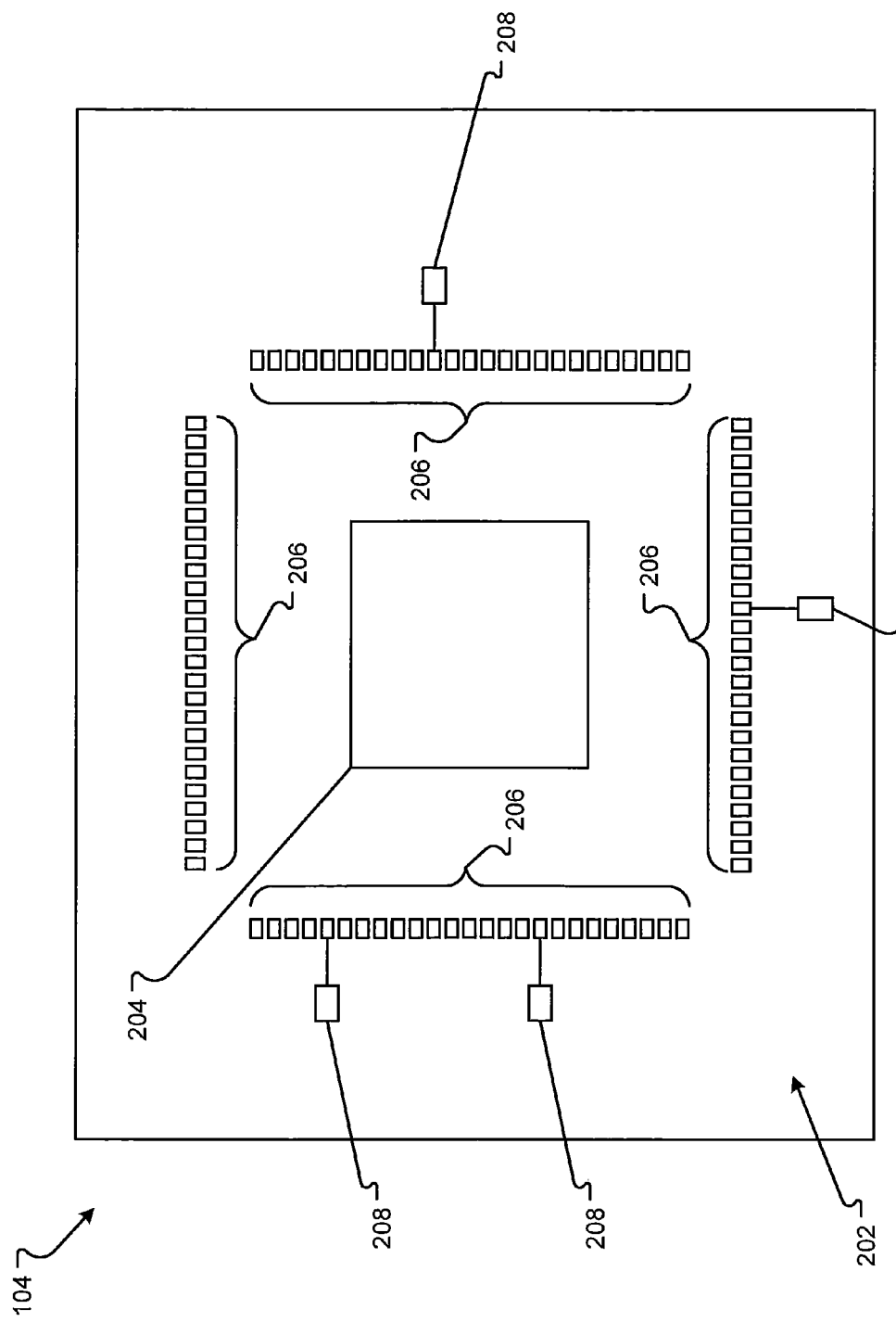

NON-DESTRUCTIVE THERMAL CONDUCTIVITY DETECTION OF SOLDER VOIDS

BACKGROUND

Some new integrated circuits chips have better thermal dissipation features. Once such integrated circuit (IC) package that has better thermal dissipation features is the thermally-enhanced quad flack pack (QFP). The thermally-enhanced QFP includes a heat sink or pad mounted to the bottom of the IC package that holds the IC. The heat sink is mounted to provide a thermal conduction path from the IC die to the substrate upon which the IC package is mounted. An example of a thermally-enhanced QFP is shown in U.S. Pat. No. 5,905,299 to Lucap or sold by Analog Devices, Inc. of Norwood, Mass. for example, part no. SP-240-1. In order to provide good thermal conductivity, the heat sink on the IC package needs to be mounted properly to a mounting pad on the substrate.

To ensure mounting wherein the thermal conductivity path is correct, solder must be applied over the entire surface of the heat sink and the mounting pad without voids. However, this mounting can prove difficult and sometimes, errors occur in the mounting of the thermally-enhanced QFP. Thus, a testing regiment must be employed to determine if the ICs package is mounted on the substrate properly. There are several methods of possibly doing this. One may be visual inspection. However, this may require the thermally-enhanced QFP to be removed to see how the soldering process worked. As such, visual inspection cannot be a 100% test, but rather, the product must be sampled because the part would have to be remounted or the part may be destroyed. In other instances, an X-ray machine may be used. However, X-ray inspection is more difficult because both the mounting pad and the heat sink are underneath the IC package of the IC and, as such, the X-ray has a difficult time imaging the surface upon which the heat sink is mounted. Thus, currently there is no good way of testing the mounting of a thermally-enhanced QFP that would test 100% of the parts and ensure good testing results.

SUMMARY

It is with respect to the above issues and other problems that the embodiments presented herein were contemplated. Systems and methods are provided herein for imaging the mounting of a thermally-enhanced QFP upon a substrate. The system includes a thermal imaging camera that is operable to image the thermal dissipation through the heat sink into the mounting pad of the substrate. In testing the thermally-enhanced QFP, the substrate or IC is connected to a power source and the IC is operated such that the IC begins to generate heat. As the heat is dissipated through the heat sink into the mounting pad, a thermal imaging camera can detect the heat conduction through the heat sink into the substrate. If there are voids or other types of failures in the mounting of the IC, the thermal imaging camera can detect cooler or colder spots in the image. In properly mounted ICs, the thermal image will show heat dissipation substantially through the entire heat sink and mounting pad. The testing process can scan each mounted chip as it comes through a manufacturing line by powering on the IC and imaging the chip. Further, the thermal imaging is better suited for detecting mounting errors because the thermal image can scan heat dissipation even with the heat sink being underneath the packing of the IC.

Non-destructive methods of testing use x-ray equipment, which can determine the density of solder as the beam penetrates the IC, heat spreader, solder, and copper pads of the circuit board. The x-ray can determine whether the solder has filled the area beneath the IC, but the x-ray cannot inspect the system to ensure good wetting has occurred. Thus, the use of the x-ray equipment is limited to whether enough solder was placed on the circuit board prior to placement of the IC. It cannot determine if the solder wetted to both the IC and mounting pad.

The embodiments use a thermal imaging camera to obtain an image of the back side of the circuit board as the assembly is operated. There is a great difference in thermal conductivity between an air gap beneath the IC and a well soldered and wetted gap. There is also a difference in the thermal flow if the solder is not wetted to the IC. The circuit board is placed in a thermally controlled environment (temperature and airflow is controlled). The thermal imaging camera images the circuit board beneath the IC in question at discrete time intervals after power is applied until a steady state condition is observed.

The combination of initial thermal change and the steady state condition will differentiate between the several different common failures; 1) total lack of solder beneath the IC (voids), 2) lack of good wetting between the solder and the IC heat spreader (cohesive bonding), and 3) partial lack of solder bridging the gap.

The phrases "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

The term "a" or "an" entity refers to one or more of that entity. As such, the terms "a" (or "an"), "one or more" and "at least one" can be used interchangeably herein. It is also to be noted that the terms "comprising", "including", and "having" can be used interchangeably.

The term "automatic" and variations thereof, as used herein, refers to any process or operation done without material human input when the process or operation is performed. However, a process or operation can be automatic, even though performance of the process or operation uses material or immaterial human input, if the input is received before performance of the process or operation. Human input is deemed to be material if such input influences how the process or operation will be performed. Human input that consents to the performance of the process or operation is not deemed to be "material".

The term "computer-readable medium" as used herein refers to any tangible storage that participates in providing instructions to a processor for execution. Such a medium may take many forms, including but not limited to, non-volatile media, volatile media, and transmission media. Non-volatile media includes, for example, NVRAM, or magnetic or optical disks. Volatile media includes dynamic memory, such as main memory. Common forms of computer-readable media include, for example, a floppy disk, a flexible disk, hard disk, magnetic tape, or any other magnetic medium, magneto-optical medium, a CD-ROM, any other optical medium, punch cards, paper tape, any other physical medium with patterns of holes, a RAM, a PROM, and EPROM, a FLASH-EPROM, a solid state medium like a memory card, any other memory chip or cartridge, or any other medium from which a computer can read. When the computer-readable media is configured as a database, it is to be understood that the database may be any type of database, such as relational, hierarchical, object-oriented, and/or the like. Accordingly, the embodiments are considered to include a tangible storage medium and prior art-recognized equivalents and successor media, in which the software implementations are stored.

The terms "determine", "calculate" and "compute," and variations thereof, as used herein, are used interchangeably and include any type of methodology, process, mathematical operation, or technique.

The term "module" as used herein refers to any known or later developed hardware, software, firmware, artificial intelligence, fuzzy logic, or combination of hardware and software that is capable of performing the functionality associated with that element.

The term "heat sink" as used herein refers to any device made from any material that absorbs or dissipates heat produced by an electrical component, such as an IC, to prevent overheating. Embodiments of heat sinks provide a heat conduction path for a device or may radiate heat.

The term "integrated circuit" or "IC" as used herein refers to any device comprising a number of connected circuit elements, such as transistors and resistors, fabricated on a chip of silicon crystal or other semiconductor material. Embodiments of the IC may also include a package that encloses the chip.

The term "mount" or "mounting pad" as used herein refers to any mechanical device with which a component is attached to a circuit board or chassis. Embodiments of the mounting pad can also function as a heat sink to conduct and dissipate heat.

The term "substrate" as used herein refers to a any device, such as a plate, a wafer, a panel, or a disk, of suitable material on (or in) which the components of a unit, such as an IC or printed circuit, are deposited or formed. A circuit board may be one embodiment of a substrate. Embodiments of the substrate may be able to conduct and/or dissipate heat.

The term "circuit board" as used herein refers to any flat piece of material, such as epoxy or phenolic resin, on which electrical components are mounted and interconnected to form a circuit.

The term "die" as used herein refers to any wafer, of any size, of useful electrical material, such as a semiconductor or a precision resistor chip. Embodiments of a die may include or form an IC that is enclosed in a package.

The term "package" as used herein refers to any enclosure for a die or IC. Examples of packages can include quad flat packs, ball grid arrays, pin grid arrays, dual inline packages, etc.

While exemplary embodiments are described, it should be appreciated that individual aspects can be separately claimed.

BRIEF DESCRIPTION OF THE DRAWINGS

The present disclosure is described in conjunction with the appended figures:

FIG. 2A is a diagram of an embodiment of a circuit board onto which a IC may be mounted;

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the second reference label.

DETAILED DESCRIPTION

The ensuing description provides embodiments only and is not intended to limit the scope, applicability, or configuration of the claims. Rather, the ensuing description will provide those skilled in the art with an enabling description for implementing the embodiments. It being understood that various changes may be made in the function and arrangement of elements without departing from the spirit and scope of the appended claims.

Figure 1:
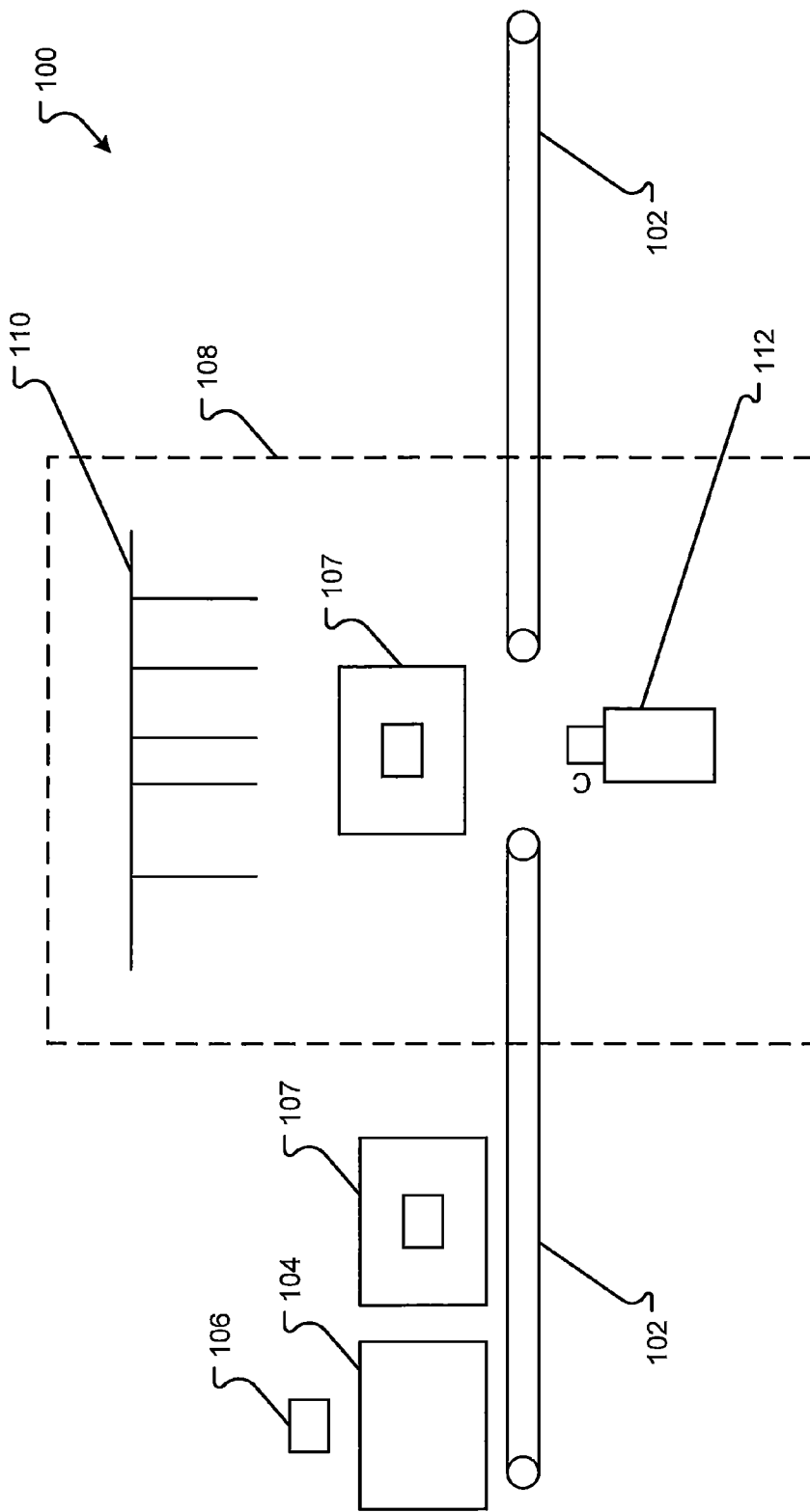
FIG. 1 is a block diagram of an embodiment of a test system and manufacturing line.

An embodiment of a manufacturing system with a test system 100 is shown in FIG. 1. The manufacturing system with a test system 100 can include a manufacturing line 102. The manufacturing line 102 can be a conveyor belt, rollers, or other system of moving or transporting articles of manufacture through the manufacturing process. In the construction of an integrated circuit board, a thermally-enhanced IC 106 is mounted upon a substrate, such as circuit board 104, to create the integrated circuit board 107. This integrated circuit board 107 can be transported along the manufacturing line 102, until the integrated circuit board 107 enters a test area 108. In the test area 108, a power harness 110 can be connected to the IC 106 to operate the IC 106. The operation of the IC 106 can generate heat which may be imaged or viewed by a thermal imaging camera or device 112. In other embodiments, power harness 110 is replaced by a heat generating device which may be placed on or near the IC 106 to create a heat source that can be used to image the connection between the IC 106 and the circuit board 104. The thermal imaging camera 112 can be any thermal imaging camera 112 that can detect thermal gradients or changes in the area of the IC 106 mounting on the circuit board 104. An example of the thermal imaging camera 112 can include DM 2900 Thermocam camera sold by Inframetrics, Inc. of North Billerica, Mass. If the IC 106 on the circuit board 104 passes one or more tests, the integrated circuit board 107 may then be sent on through the manufacturing process. However, if the mounting of the IC 106 does not pass the thermal imaging test, the failed circuit board 107 may be removed from the manufacturing process and be reworked to properly mount the IC 106. In other embodiments, the failed circuit board may be disposed.

Figure 2B:
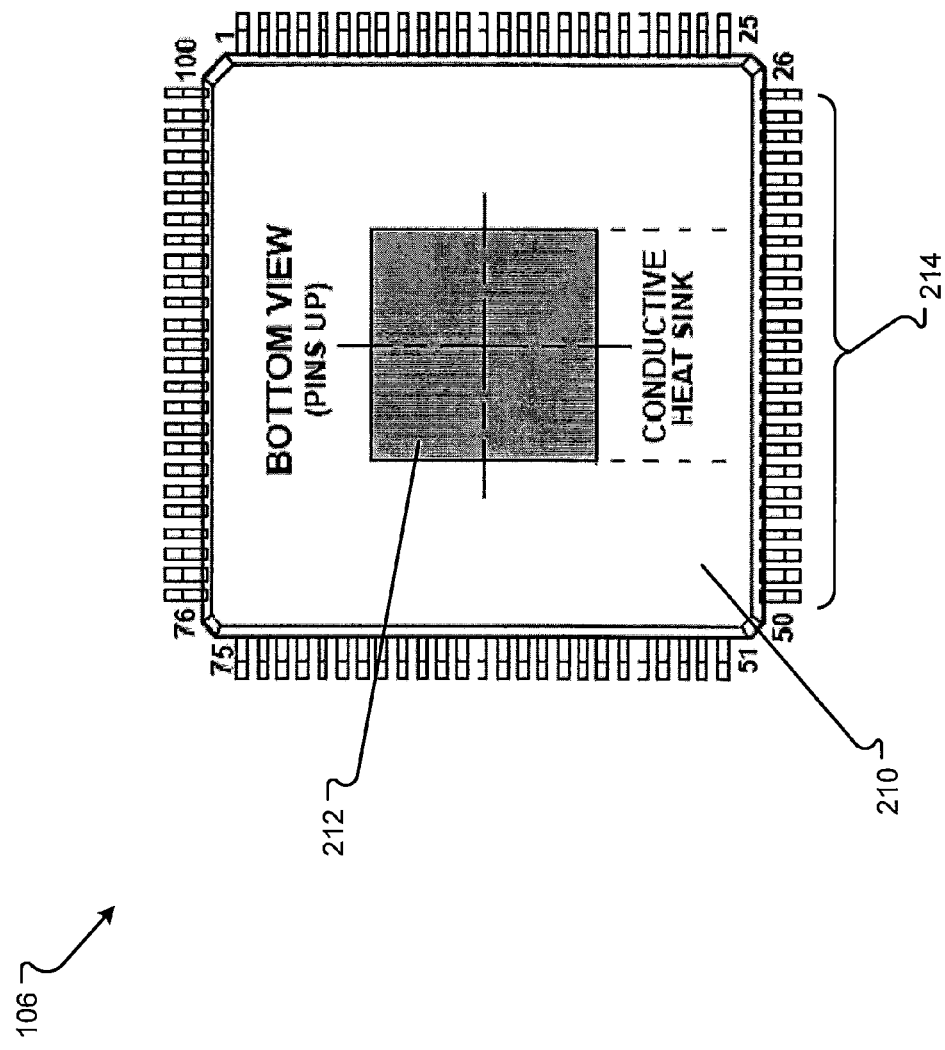
FIG. 2B is a block diagram of an embodiment of an IC.
Figure 2C:
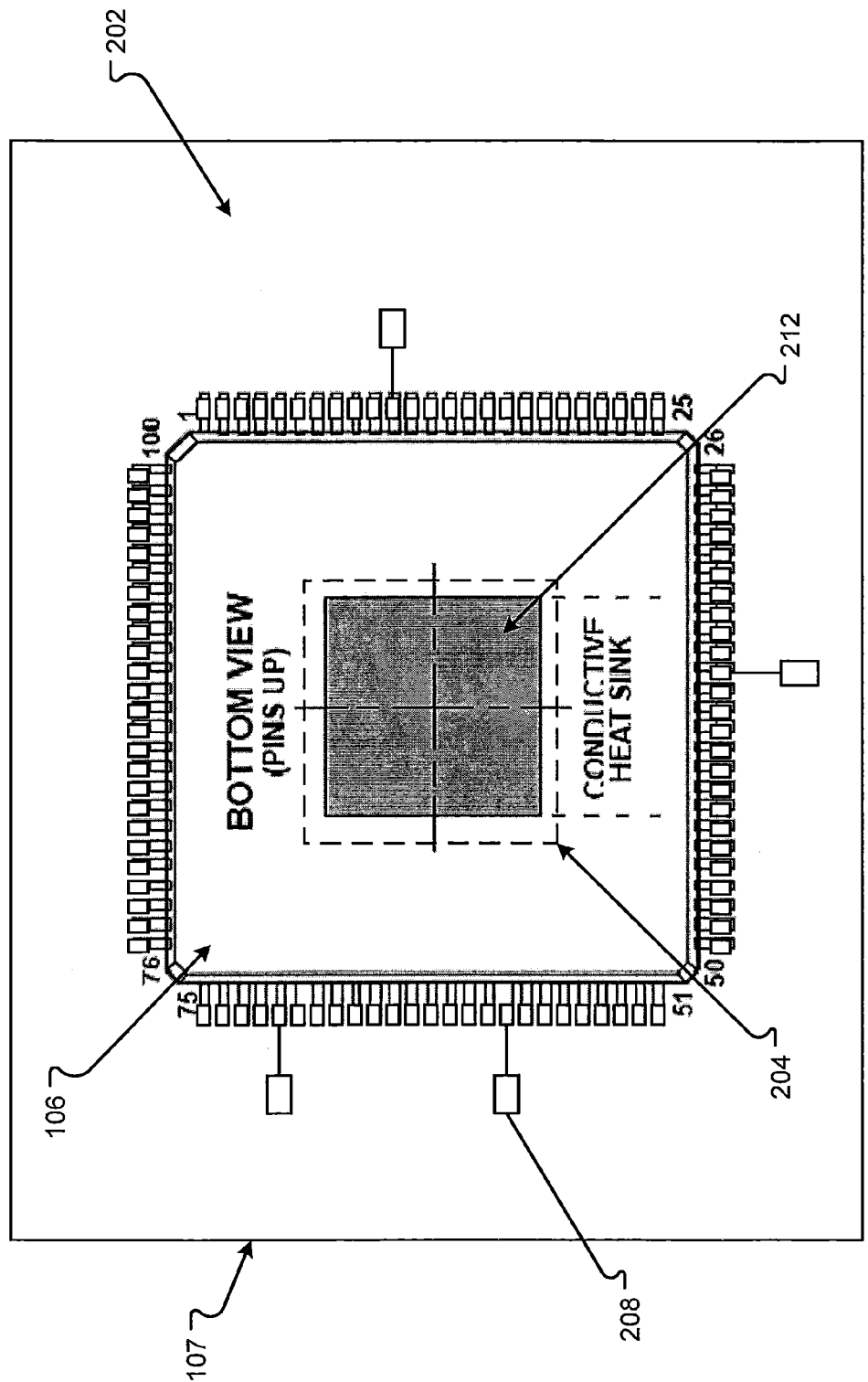
FIG. 2C is a block diagram of an embodiment of an integrated circuit board where an IC is mounted on a circuit board.

Embodiments of integrated circuit board 107 shown before and after the mounting of a thermally-enhanced IC 106 is shown in FIGS. 2A and 2C. The circuit board 104 before mounting, shown in FIG. 2A, can include a substrate 202, which may be a printed circuit board or some other mounting hardware, one or more electrical connection pads 206 for mounting an IC 106, one or more harness connection points 208, a mounting pad 204, and one or more other electrical components (not shown). The substrate 202 can include a mounting pad 204 which generally is constructed of a thermally-conductive material such as metal. The metal or thermally-conductive pad can dissipate heat from the heat sink of the thermally-enhanced IC 106 through the substrate 202. The substrate 202 can include one or more electrical connection pads 206 which may be used to mount the pins, balls, or other leads which send electrical systems into and out of the IC 106 from the substrate 202.

The substrate 202 may also include one or more harness connection points 208A through C that connect to one or more of the electrical connection pads 206. These harness connection points 208 allow for the power harness 110 to be coupled or placed in electrical connection with the IC 106 once the IC 106 is mounted. In other embodiments, the substrate 202 does not include harness mounting points 208, as the power harness 110 can connect directly to the pins or leads of the IC 106.

An embodiment of a thermally-enhanced integrated circuit 106 is shown in FIG. 2B. An IC 106 can be a die that includes the integrated circuit components enclosed in a package 210 that mounts to a circuit board 104. FIG. 2B provides a prospective of the underside of the IC 106. It should be noted that a thermal-enhanced quad flack pack is shown in FIG. 2B. However, other types of thermally-enhanced ICs 106 may be used. For example, the manufacturing system with a test system 100 is operable to test dual inline package ICs, ball grade array ICs, pin grid array ICs, small outline package ICs, or other types of IC packages. Here, the heat sink 212 is shown on the bottom of the IC 106. The heat sink 212 may be in thermal conductivity with the die within the IC package 210 of the IC 106. The package 210 is the enclosure that houses the die that is placed within the IC package 210 of the IC 106. The IC package 210 may include one or more pins or leads 214 extending from the IC package 210. The pins 214 make electrical connections between the substrate 202104 and the die within the IC package 210.

Figure 2D:
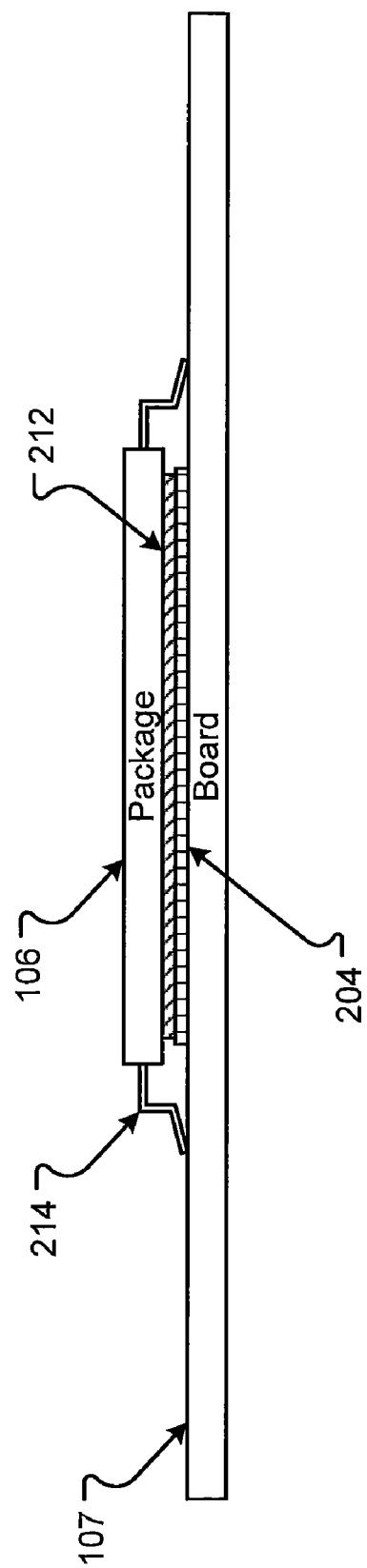
FIG. 2D is another block diagram of an embodiment of an integrated circuit board where an IC is mounted on a circuit board.

An embodiment of the circuit board 104 with the IC 106 mounted upon it is shown in FIGS. 2C and 2D, although from different perspectives. Here, the IC 106 is shown as mounted to the substrate 202, where the heat sink 212 is in thermal conductivity or connection with the mounting pad 204. This drawing can show the final manufacturing stage or may be an intermediate stage where other electrical components may be placed on the electrical substrate 202. Regardless, the integrated circuit board 107 can be tested with the IC 106 mounted to determine if the thermal connection between the heat sink 212 and the mounted pad 204 is proper and functional.

Figure 3A:
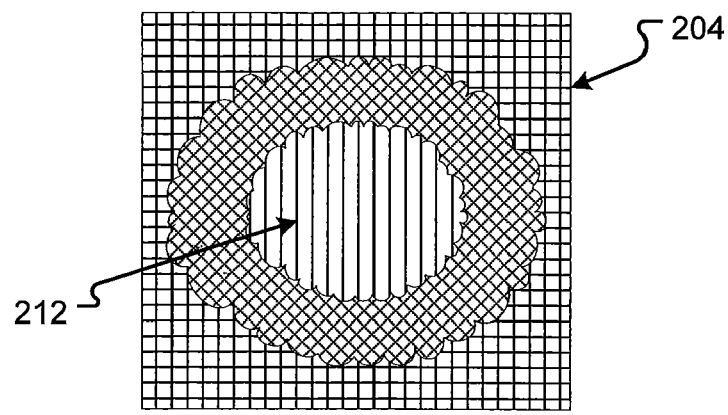
FIGS. 3A through 3C are diagrams of embodiments of thermal images produced from a thermal imaging camera that viewed one or more of an mounted ICs.
Figure 3B:
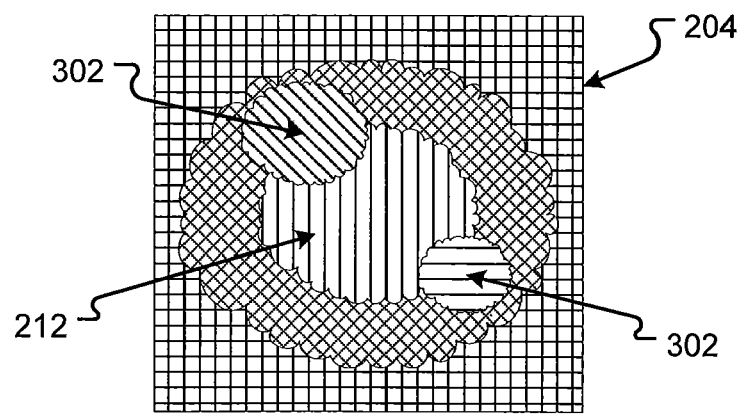
Figure 3C:
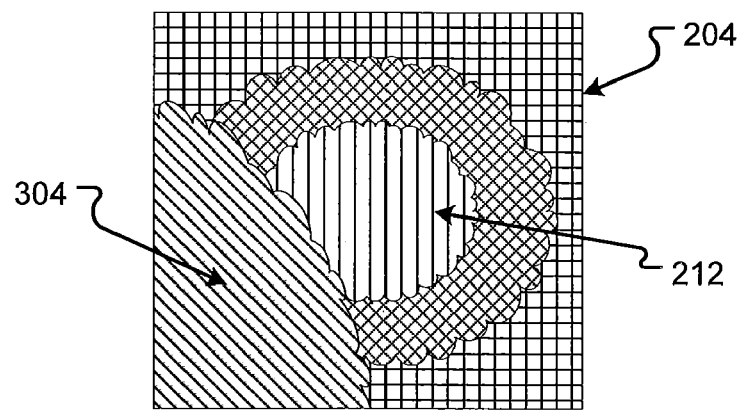

Embodiments of the views from the thermal imaging camera 112 of the tested integrated circuit board 107 are shown in FIGS. 3A through 3C. In FIG. 3A, a properly mounted thermally-enhanced QFP is shown where the red area or lighter area between the heat sink 212 and the mounting pad 204 is shown. Here, the thermal conductivity is good between the heat sink 212 and the mounting pad 204 and, thus, the IC 106 is mounted properly upon the circuit board 104.

Several errors can occur in mounting the thermally-enhanced IC 106 to substrate 202. Those errors can include voids in the soldering, can include solder which does not fully bridge the gap between the heat sink 212 and the mounting pad 204, bad wetting of the heat sink 212 and/or mounting pad 204, or other types of errors. Thermal images of some of these errors are shown in FIGS. 3B and 3C. In FIG. 3B, the darker or blue areas 302 show that there are voids in the soldering between the heat sink 212 and the mounting pad 204. Thus, there is not good thermal conduction between the heat sink 212 and the mounting pad 204. The integrated circuit board 107 shown in FIG. 3B would need to be reworked to remount the IC 106 on the substrate 202. FIG. 3C shows a darker area 304 shown in the thermal image view that shows, while the solder has been placed along the entire surface between the heat sink 212 and the mounting pad 204, there is an area where the solder does not fully bridge the gap between the heat sink 212 and the mounting pad 204. As such, heat may be dissipated through this area, but the connection is not providing as good a thermal conduction path as can be provided if the IC 106 is properly mounted on the circuit board 104.

Figure 4:
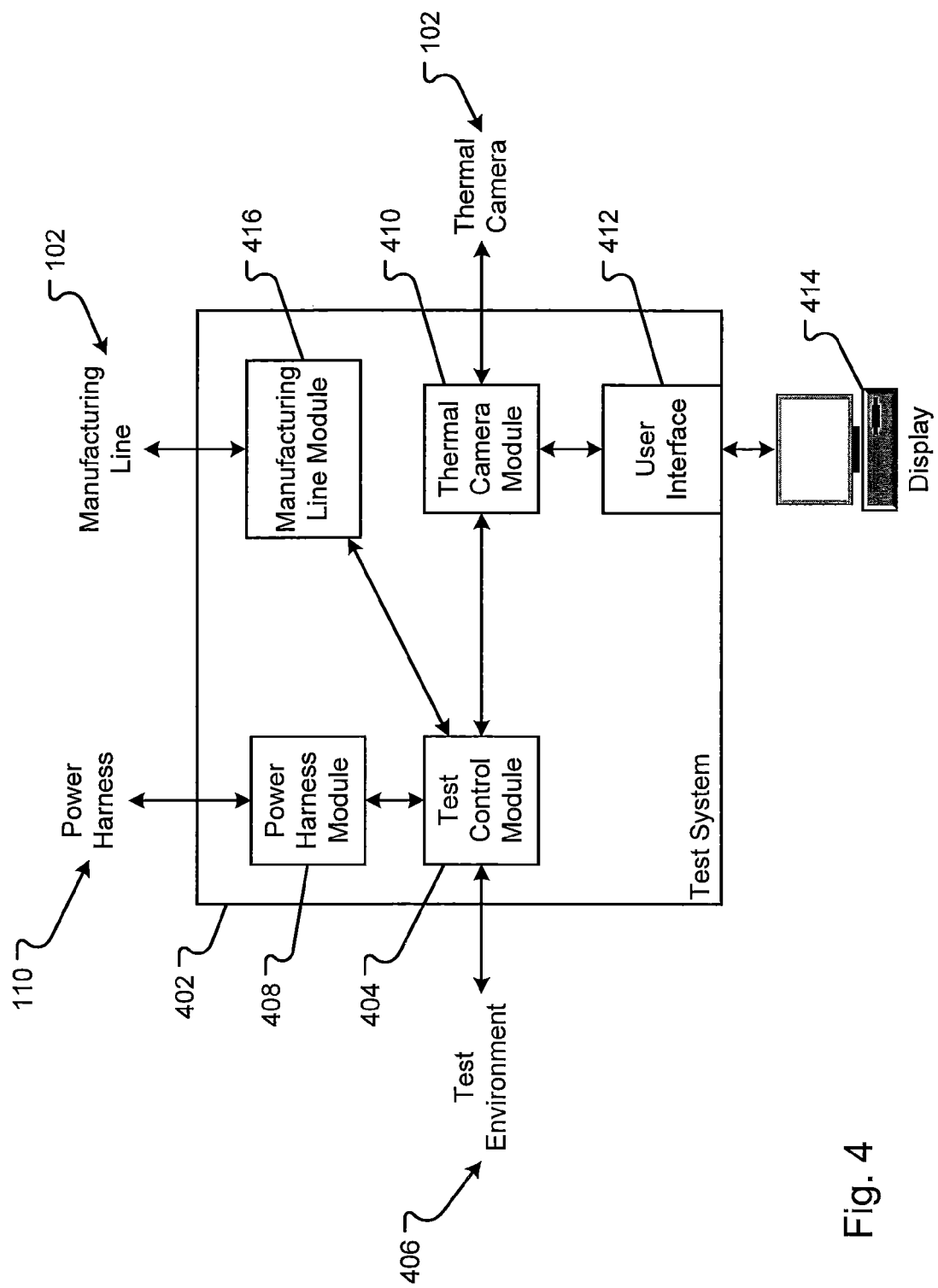
FIG. 4 is a block diagram of an embodiment of a test system.

An embodiment of a test system 402 is shown in FIG. 4. The test system 402 may include one or more software modules that are executed on a computer system as described in conjunction with FIGS. 7 and 8. In other embodiments, the modules may be incorporated in a hardware system, such as a Field Programmable Gate Array or an Application Specific Integrated Circuit. The test system 402 can include a test control module 404, a power harness module 408, a thermal camera module 410, a manufacturing line module 416, and a user interface 412.

The test control module 404 can receive one or more inputs from the test environment 406 that shall dictate how tests are conducted. The test environment 406 may be the same or similar to the test area 108 shown in FIG. 1. An input can be anything that can initiate, modify, or terminate testing of an integrated circuit board 107. For example, the test environment input could include an indication that a new integrated circuit board 107 has entered the test area 108 and needs to begin testing. Other environmental inputs can include the pausing of the manufacturing line 102 or changes in the speed or rate at which integrated circuit boards 107 are made. Further, the test control module 404 is also responsible for controlling the one or more other modules in the test system 402. As such, the test control module 404 can send command signals to the other modules to have the other modules execute functions or may receive inputs from the other modules that can cause the test control module 404 to conduct actions.

The power harness module 408 is a component which controls the power harness 110. As such, the power harness module 408 can maneuver or move the power harness 110 such that the power harness 110 is electrically connected to the IC 106. Further, the power harness module 408 can signal or cause the power harness 110 to supply power to the IC 106, thus, creating heat from the execution of the IC 106. The power harness module 408 can also conduct one or more communications sequences with the IC 106 to cause the IC 106 to execute one or more operations that can generate heat.

The manufacturing line module 416 communicates to the manufacturing line 102. Thus, the manufacturing line module 416 can cause manufacturing line 102 to stop, speed up, pause, or other execute other functions that are required in order to test the circuit board 104. The thermal camera module 410 is operable to control thermal imaging camera 112. Thus, the thermal camera module 410 can cause the thermal imaging camera 112 to move, focus, or generate a picture which can be sent from the thermal camera module 410 to the user interface 412 to be displayed on a display device 414 (or "display" 414). The thermal camera module 410 may also adjust the thermal imaging camera 112 to produce a better picture based on one or more user inputs received through a user interface 412 that are received by the test control module 404. The test control module 404 may also interact with the user through the user interface 412. Thus, test system 402 configuration changes or tests may be received in the test control module 404 through the display 414 or user interface 412.

Figure 5:
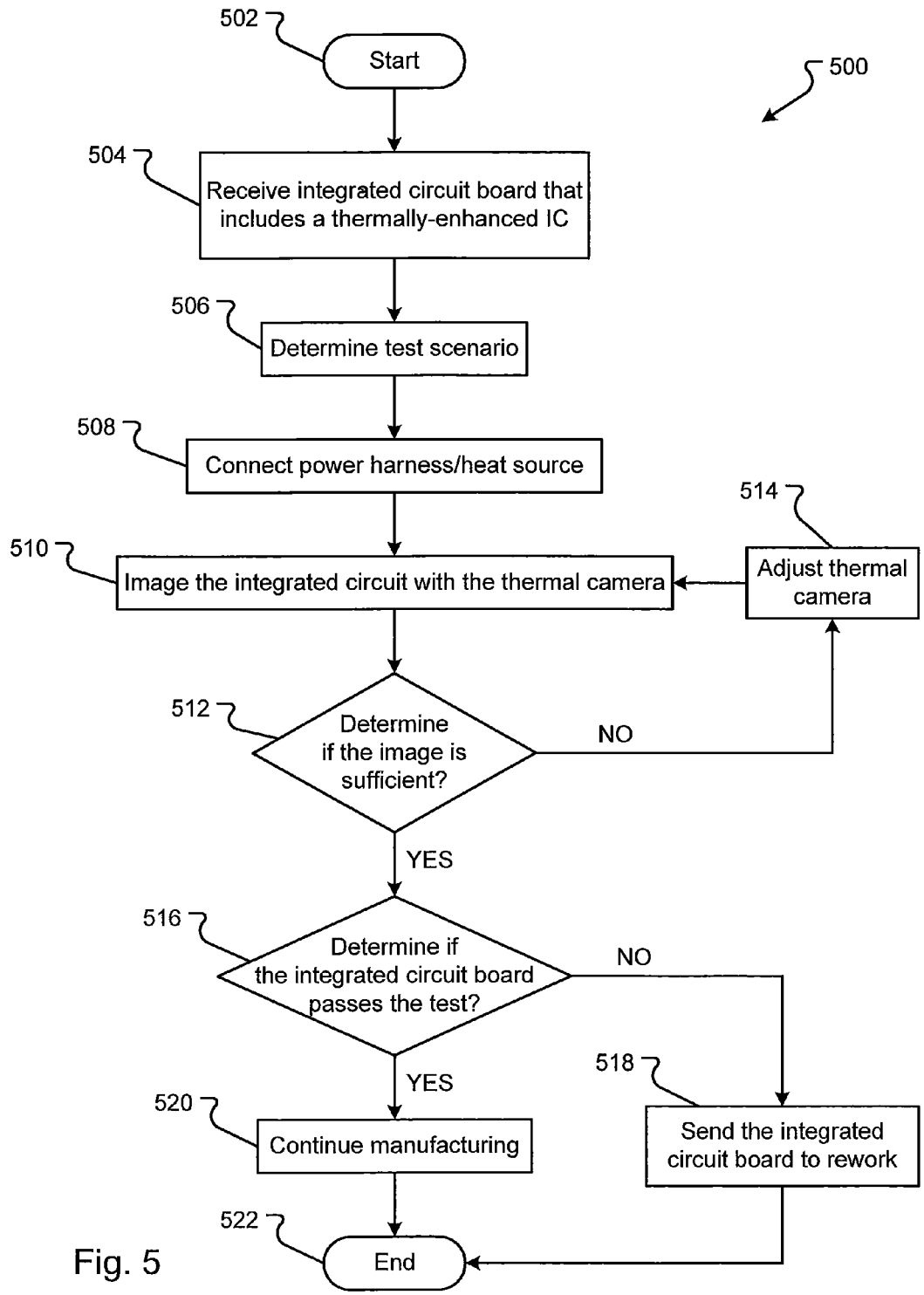
FIG. 5 is a flow diagram of an embodiment of a process for testing a mounted thermally-enhanced IC.

An embodiment of a process to test an integrated circuit board 107 is shown in FIG. 5. Generally, the method 500 begins with a start operation 502 and terminates with an end operation 522. While a general order for the steps of the method 500 are shown in FIG. 5, the method 500 can include more or fewer steps or arrange the order of the steps differently than those shown in FIG. 5. The method 500 can be executed as a set of computer-executable instructions executed by a computer system and encoded or stored on a computer readable medium. Hereinafter, the method 500 shall be explained with reference to the systems, components, modules, software, data structures, etc. described in conjunction with FIGS. 1-4.

The test area 108 receives an integrated circuit board 107 having a thermally-enhanced IC 106 placed on the circuit board 104, in step 504. The manufacturing line 102 can move the integrated circuit board 107 into the test area 108. Once in the test area 108, the test system 402 can recognize that the integrated circuit board 107 has entered the test area 108. The test system 402 may determine what type of integrated circuit board 107 has entered the test area 108. For example, the test system 402 can receive an input from the test environment 406 to the test control module 404. The input can be a part number scan or some other identification, which may be received by any known method, such as RFID, visual or scanning, or other methods. In embodiments, the manufacturing line 102 may be controlled by the manufacturing line module 416, such that as integrated circuit boards 107 enter the test area 108, the manufacturing line 102 can be stopped, slowed, or proceed as normal depending upon signals sent from the manufacturing line module 416.

Once the test control module 404 has determined that an integrated circuit board 107 has entered the test area 108, the test control module 404 can determine a test scenario, in step 506. A test scenario is any test or set of tests that may be performed on the integrated circuit board 107 while in the test area 108. One of those tests can be the thermal imaging of the IC 106 to determine if the soldering or physical fixation of the thermally-enhanced IC 106 to the circuit board 104 passes a set of criteria or tests. If the test control module 404 determines that a thermal image test will be performed, the test control module 404 can execute the tests in an area for imaging the IC 106 with the thermal imaging camera 112.

The test control module 404 may first send a signal to the power harness module 408 or some other module to connect a heat source or power harness 110 to the IC 106, in step 508. Thus, the power harness module 408 may maneuver the power harness 110 into physical connection with the IC 106. The power harness module 408 may then instruct the power harness 110 to send an electric current or power to the IC 106 or to send one or more other signals to cause the IC 106 to generate heat. In other embodiments, the power harness module 408 may control another heat source besides the power harness 110, which may be connected to the heat sink 212 or the pad 204 on the circuit board 104. The test control module 404 may wait a period of time based on the test scenario and then may instruct the thermal camera module 410 to execute a test or scan with thermal imaging camera 112.

The thermal camera module 410 can send a signal to the thermal imaging camera 112 to image the IC 106 after the heat has substantially increased to conduct a scan, in step 510. The thermal imaging camera 112 can take one or more pictures or may take a video of the IC 106 and send the information back to the thermal camera module 410. The thermal camera module 410 may determine if the thermal images sent from the thermal imaging camera 112 are sufficient, in step 512. For example, the thermal camera module 410 may determine whether the images meet or pass one or more tests that detect whether the thermal imaging camera 112 operated correctly. For example, the thermal camera module 410 may determine if there are a predetermined number of pixels that were within a color range that would indicate heat has been detected. If a sufficient number of pixels are shown, the thermal camera module 410, may determine if there are voids within the picture, (e.g. pixels that are not showing color), or some other test that can determine if the image has been taken correctly by the thermal imaging camera 112. If the image is not sufficient, step 512 proceeds "NO" to step 514, where the thermal camera module 410 may adjust the thermal imaging camera 112. Adjusting the thermal imaging camera 112 may include changing the focus, changing the position, or changing of one or more internal settings of the thermal imaging camera 112 to create a better image. If the thermal imaging camera 112 cannot be adjusted, the thermal camera module 410 may send an error message to the test control module 404, which may then be the error message, to be presented to a display 414 through the user interface 412. Once presented, the error message can instruct test personnel to inspect the thermal imaging camera 112 to ensure it is operating correctly. If the image is sufficient, step 512 proceeds "YES" to step 516.

In step 516, the test control module 404, or a human tester, may determine if the IC 106 passes the thermal image test. The thermal image, from the thermal imaging camera 112, may be passed from the thermal camera module 410 through a user interface 412 to a display 414. Once on a display 414, a human tester may view the thermal image and determine if the connection of the thermally-enhanced IC 106 to the circuit board 104 has one or more possible errors as described in FIG. 3A or 3C, or one or more errors that may be determined from the thermal image.

In other embodiments, the test control module 404 or thermal camera module 410 can conduct an automatic test of the image. For example, the thermal camera module 410 or test control module 404 can scan for pixels which are not within a certain color range of other surrounding pixels. The scan may be isolated to those pixels that should be within the heat dissipation area of the heat sink 212 and the mounting pad 204. For example, if a color is more blue or green, rather than orange, yellow, or red, then there may be some problem with the soldering of the IC 106 to the circuit board 104. If the integrated circuit board 107 passes the test, step 516 proceeds "YES" to continue manufacturing, in step 520. In that case, the integrated circuit board 107 may proceed down the manufacturing line 102 or may begin the process of being shipped to a customer. If the integrated circuit board 107 does not pass the test, step 516 proceeds "NO" to step 518. In step 518, the integrated circuit board 107 may be sent to be reworked and the IC 106 re-soldered onto the circuit board 104.

Figure 6:
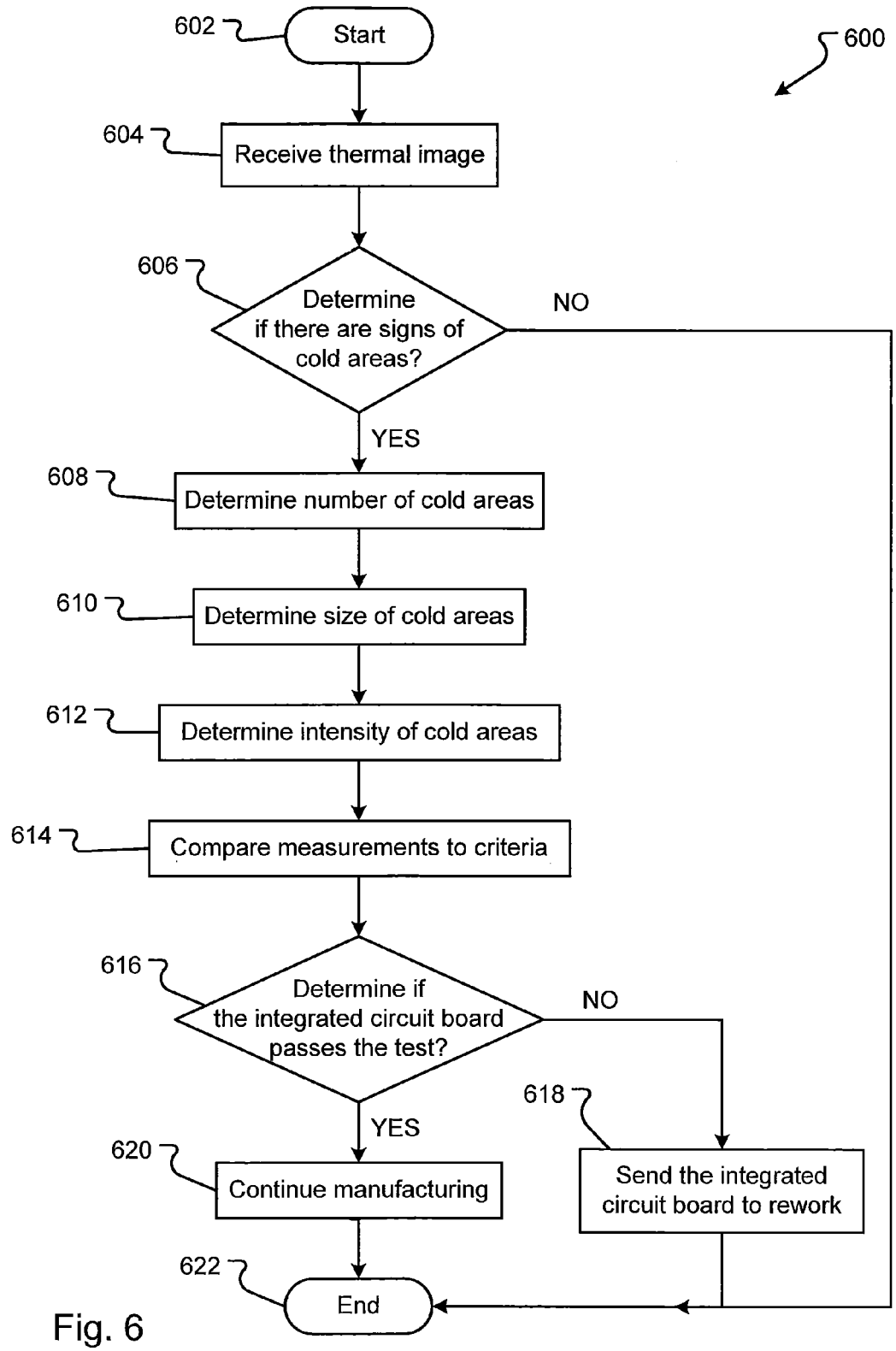
FIG. 6 is a flow diagram of an embodiment of a process for testing a mounted thermally-enhanced IC.

An embodiment of a method 600 for testing an integrated circuit board 107 with a thermal imaging camera 112 is shown in FIG. 6. Generally, the method 600 begins with a start operation 602 and terminates with an end operation 622. While a general order for the steps of the method 600 are shown in FIG. 6, the method 600 can include more or fewer steps or arrange the order of the steps differently than those shown in FIG. 6. The method 600 can be executed as a set of computer-executable instructions executed by a computer system and encoded or stored on a computer readable medium. Hereinafter, the method 600 shall be explained with reference to the systems, components, modules, software, data structures, etc. described in conjunction with FIGS. 1-4.

A test system 402 receives a thermal image, in step 604. The thermal image may be sent from a thermal imaging camera 112 to a thermal camera module 410 in the test system 402. The thermal image can be processed either by the thermal camera module 410, or by a test control module 404. Thus, if the test control module 404 is to process the thermal image, the thermal camera module 410 sends the thermal image to the test control module 404.

Testing for whether the thermally-enhanced IC 106 is properly mounted to the circuit board 104 may be done automatically. As such, the thermal camera module 410 or test control module 404 can scan the thermal image to determine if there are signs of cold or cool areas, in step 606. A cold or cool area may be determined by the thermal module 410 or the test control module 404 by the color value for pixel within the thermal image. For example, there may be a pre-determined threshold set by a tester where if the pixel value for color is below that value, then the pixels determine to be cold or cool. In other embodiments, the tester may set a range of pixel values which designate a cold area. Generally, the pixel values will be four colors in the yellow, green, blue, purple, or other dark color values. If there are cold areas within the thermal image, step 606 may proceed "YES" to step 608. If there are no signs or a limited amount of signs of cold areas, step 606 may proceed "NO" to the end operation 622. Thus, the thermal camera module 410 or test control module 404 can determine if there are enough cold areas within the thermal image to warrant further investigation.

The test control module 404 or the thermal cameral module 410 may then automatically determine the number of cold areas, in step 608. A cold area may be determined by a pre-determined number of pixels that are within close proximity of each other. For example, to be designated as a cold area, two or more pixels may need to be in close proximity. In other embodiments, the number of pixels can be set by the tester to be any number of pixels, for example, two or more pixels may designate a cold area. The pixels may be in close proximity if they were a pre-determined number of pixels from each other. For example, if the two pixels are of each other, then those two pixels are deemed to be within close proximity. The number of pixels, required to be designated within close proximity, may be set by the tester and can be any number of pixels. After determining the cold areas, the test control module 404 or the thermal camera module 410 can count the number of designated cold areas.

The thermal camera module 410 or test control module 404 may then determine the size of the cold areas counted in step 608, in step 610. The size of the cold areas may be determined by the number of pixels having a dark color value within the cold area. Thus, the thermal camera module 410 or test control module 404 can count the number of pixels in each of the different cold areas. In other embodiments, another type method for determining the size of the cold area may be used. For example, the test control module 404 or thermal camera module 410 may determine a relative area for the cold areas. This area may be deduced by a physical measurement of the cold area and comparing that to the relative scale of the thermal image. For example, if the thermal image represents a ten times view of the thermally-enhanced IC 106, then the physical measurement of the cold area can be multiplied by ten to determine the actual physical area of the cold area in the thermal image.

The thermal camera module 410 or test control module 404 may then determine intensity for each of the cold areas, in step 612. The intensity of a cold area can be determined by the pixel values of the darker areas within the cold areas. For example, an average value for the pixels within the cold area may be determined. Thus, each pixel value may be summed and divided by the total number of pixels within the cold area to determine the average. This average pixel value can be compared against the threshold or can be compared to other cold areas within the thermal image. Regardless, the average intensity of the pixels within the cold area can give a relative idea of the intensity of the cold area.

To determine whether the thermally-enhanced IC 106 is properly mounted to the circuit board 104, the thermal camera module 410 or test control module 404 can compare the different measurements provided or generated from step 608, 610 and 612 to one or more criteria, in step 614. The criteria may be established by a tester and entered into the test control module 404 for the test scenario. Each different measurement from step 608, 610, and 612 may be measured or compared against separate criteria. For example, the number of cold areas can be compared to a threshold, for example, three cold areas, to determine if the number of cold areas is over a threshold for whether the thermally-enhanced IC 106 is properly mounted to the circuit board 104. In another example, the size of the cold areas can be compared against the threshold, for example, five pixels within the cold area, to determine if the thermally-enhanced IC 106 is mounted properly. Further, the intensity of the cold area can be compared against the threshold, such as a maximum intensity of a cold area compared to the average pixel value for each of the cold areas or a maximum intensity threshold for all cold areas compared to an average of all cold area pixels in all of the cold areas. If any one of the criteria or measurements crosses the threshold, then the thermally-enhanced IC 106 to determine not to be properly mounted. In other embodiments, either all three tests fail or one or more tests must fail, as set by a tester.

The thermal camera module 410 or test control module 404 may be determined by the comparison to the criteria whether the integrated thermally-enhanced IC 106 is mounted properly to the circuit board 104 and the integrated circuit board 107 passes the test, in step 616. As such, the thermal camera module 410 or test control module 404 may evaluate each of the comparisons to the criteria and determine based on pre-determined requirements from the tester whether the integrated circuit board 107 passes the thermal imaging test. If the integrated circuit board 107 passes the thermal imagining test in step 616 proceeds "YES" to step 620. In contrast, if the integrated circuit board 107 does not pass the thermal imaging test in step 616 proceeds "NO" to step 618.

In step 618, the integrated circuit board 107 is sent to a rework station to be reworked. In embodiments, the thermally-enhanced IC 106 may be removed from the circuit board 104 and re-soldered and tested again. In other embodiments, the circuit board 104 may be scrapped.

In step 620, the integrated circuit board 107 can continue manufacturing. Continue manufacturing may be the placement of one or more additional parts, thermal coating, or other steps used in the manufacturing process. In embodiments, the integrated circuit board 107 reaches the end of manufacturing and packaged and shipped to a customer.

Figure 7:
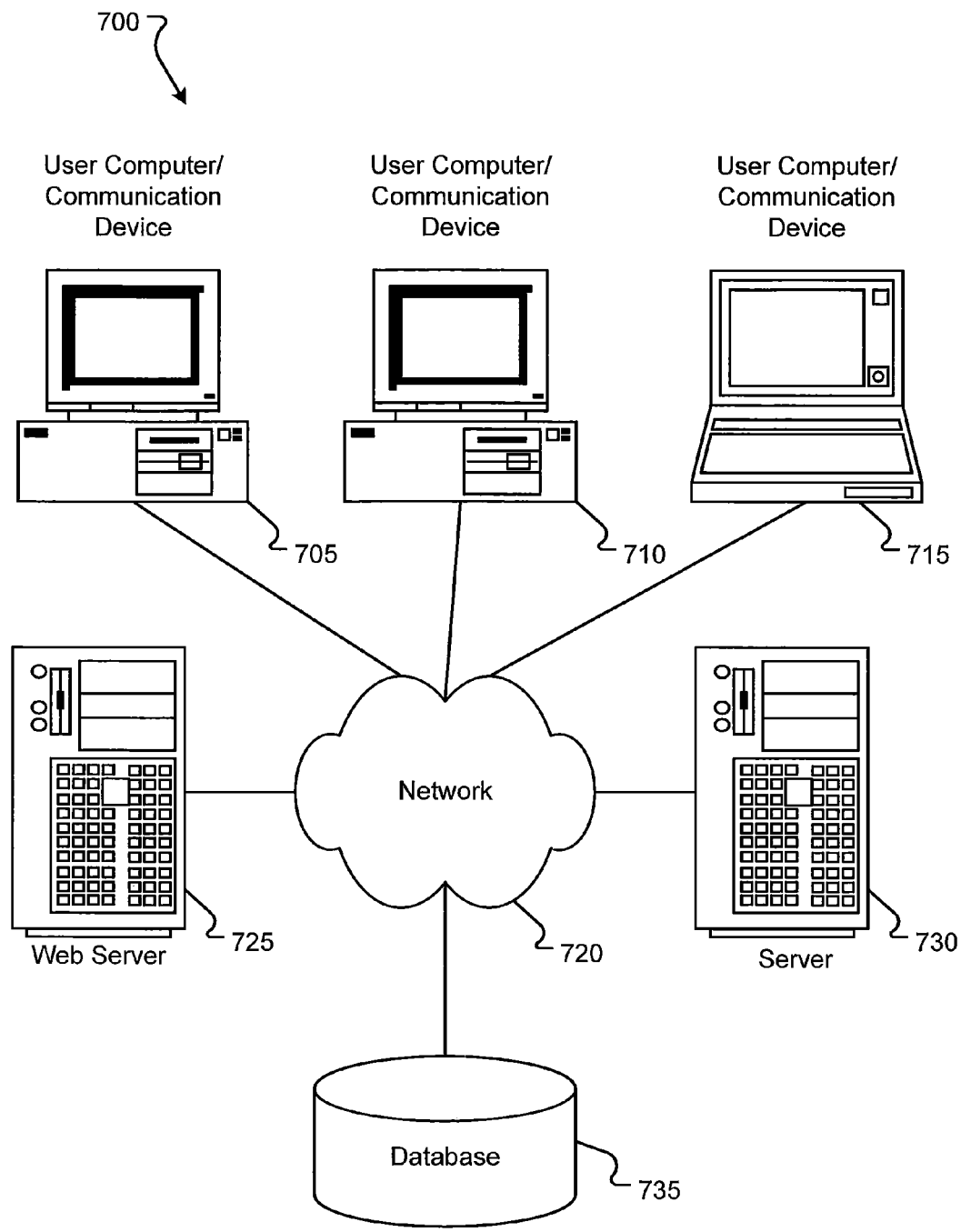
FIG. 7 is a block diagram of an embodiment of a computer system environment in which the systems and methods may be executed.

FIG. 7 illustrates a block diagram of a computing environment 700. The system 700 includes one or more computers 705, 710, and 715. The computers 705, 710, and 715 may be general purpose personal computers (including, merely by way of example, personal computers and/or laptop computers running various versions of Microsoft Corp.'s Windows® and/or Apple Corp.'s Macintosh® operating systems) and/or workstation computers running any of a variety of commercially-available UNIX® or UNIX-like operating systems. These computers 705, 710, 715 may also have any of a variety of applications, including for example, database client and/or server applications, and web browser applications. Alternatively, the computers 705, 710, and 715 may be any other electronic device, such as a thin-client computer, mobile telephone, mobile device, Internet-enabled mobile telephone, and/or personal digital assistant, capable of communicating via a network (e.g., the network 720 described below) and/or displaying and navigating web pages or other types of electronic data. Although the exemplary system 700 is shown with three computers, any number of computers may be supported.

System 700 further includes a network 720. The network 720 may can be any type of network familiar to those skilled in the art that can support data communications using any of a variety of commercially-available protocols, including without limitation TCP/IP, SNA, IPX, AppleTalk, and the like. Me'rely by way of example, the network 720 maybe a local area network ("LAN"), such as an Ethernet network, a Token-Ring network and/or the like; a wide-area network; a virtual network, including without limitation a virtual private network ("VPN"); the Internet; an intranet; an extranet; a public switched telephone network ("PSTN"); an infra-red network; a wireless network (e.g., a network operating under any of the IEEE 802.11 suite of protocols, the Bluetooth® protocol known in the art, and/or any other wireless protocol); and/or any combination of these and/or other networks.

The system 700 may also include one or more server computers 725 and 730. The server computers 725 and/or 730 can represent the test system 402. One server may be a web server 725, which may be used to process requests for web pages or other electronic documents from user computers 705, 710, and 720. The web server can be running an operating system including any of those discussed above, as well as any commercially-available server operating systems. The web server 725 can also run a variety of server applications, including HTTP servers, FTP servers, CGI servers, database servers, Java servers, and the like. In some instances, the web server 725 may publish operations available operations as one or more web services.

The system 700 may also include one or more file and or/application servers 730, which can, in addition to an operating system, include one or more applications accessible by a client running on one or more of the user computers 705, 710, 715. The server(s) 730 may be one or more general purpose computers capable of executing programs or scripts in response to the user computers 705, 710 and 715. As one example, the server may execute one or more web applications. The web application may be implemented as one or more scripts or programs written in any programming language, such as Java™, C, C# or C++, and/or any scripting language, such as Perl, Python, or TCL, as well as combinations of any programming/scripting languages. The application server(s) 730 may also include database servers, including without limitation those commercially available from Oracle, Microsoft, Sybase™, IBM™ and the like, which can process requests from database clients running on a user computer 705.

The web pages created by the web application server 730 may be forwarded to a user computer 705 via a web server 725. Similarly, the web server 725 may be able to receive web page requests, web services invocations, and/or input data from a user computer 705 and can forward the web page requests and/or input data to the web application server 730.

In further embodiments, the server 730 may function as a file server. Although for ease of description, FIG. 7 illustrates a separate web server 725 and file/application server 730, those skilled in the art will recognize that the functions described with respect to servers 725, 730 may be performed by a single server and/or a plurality of specialized servers, depending on implementation-specific needs and parameters.

The system 700 may also include a database 735. The database 735 may reside in a variety of locations. By way of example, database 735 may reside on a storage medium local to (and/or resident in) one or more of the computers 705, 710, 715, 725, 730. Alternatively, it may be remote from any or all of the computers 705, 710, 715, 725, 730, and in communication (e.g., via the network 720) with one or more of these. In a particular set of embodiments, the database 735 may reside in a storage-area network ("SAN") familiar to those skilled in the art. Similarly, any necessary files for performing the functions attributed to the computers 705, 710, 715, 725, 730 may be stored locally on the respective computer and/or remotely, as appropriate. In one set of embodiments, the database 735 may be a relational database, such as Oracle 10i®, that is adapted to store, update, and retrieve data in response to SQL-formatted commands.

Figure 8:
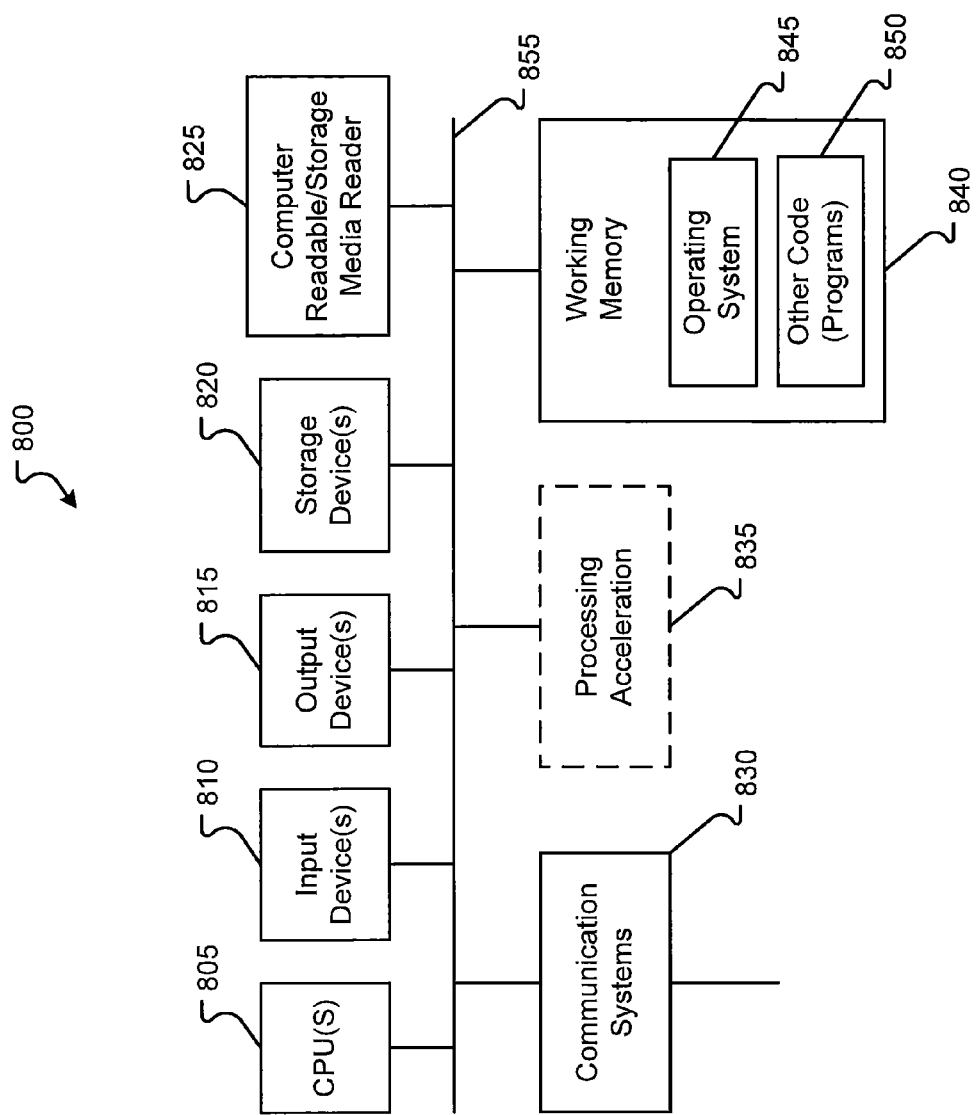
FIG. 8 is a block diagram of a computer system in which the systems and methods may be executed.

FIG. 8 illustrates one embodiment of a computer system 800 upon which the test system 402 may be deployed or executed. The computer system 800 is shown comprising hardware elements that may be electrically coupled via a bus 855. The hardware elements may include one or more central processing units (CPUs) 805; one or more input devices 810 (e.g., a mouse, a keyboard, etc.); and one or more output devices 815 (e.g., a display device, a printer, etc.). The computer system 800 may also include one or more storage devices 820. By way of example, storage device(s) 820 may be disk drives, optical storage devices, solid-state storage devices, such as a random access memory ("RAM") and/or a read-only memory ("ROM"), which can be programmable, flash-updateable, and/or the like.

The computer system 800 may additionally include a computer-readable storage media reader 825; a communications system 830 (e.g., a modem, a network card (wireless or wired), an infra-red communication device, etc.); and working memory 840, which may include RAM and ROM devices as described above. In some embodiments, the computer system 800 may also include a processing acceleration unit 835, which can include a DSP, a special-purpose processor and/or the like The computer-readable storage media reader 825 can further be connected to a computer-readable storage medium, together (and, optionally, in combination with storage device (s) 820) comprehensively representing remote, local, fixed, and/or removable storage devices plus storage media for temporarily and/or more permanently containing computer-readable information. The communications system 830 may permit data to be exchanged with the network 820 and/or any other computer described above with respect to the system 800. Moreover, as disclosed herein, the term "storage medium" may represent one or more devices for storing data, including read only memory (ROM), random access memory (RAM), magnetic RAM, core memory, magnetic disk storage mediums, optical storage mediums, flash memory devices, and/or other machine readable mediums for storing information.

The computer system 800 may also comprise software elements, shown as being currently located within a working memory 840, including an operating system 845 and/or other code 850, such as program code implementing the components and software described herein. It should be appreciated that alternate embodiments of a computer system 800 may have numerous variations from that described above. For example, customized hardware might also be used and/or particular elements might be implemented in hardware, software (including portable software, such as applets), or both. Further, connection to other computing devices such as network input/output devices may be employed.

In the foregoing description, for the purposes of illustration, methods were described in a particular order. It should be appreciated that in alternate embodiments, the methods may be performed in a different order than that described. It should also be appreciated that the methods described above may be performed by hardware components or may be embodied in sequences of machine-executable instructions, which may be used to cause a machine, such as a general-purpose or special-purpose processor or logic circuits programmed with the instructions to perform the methods. These machine-executable instructions may be stored or one or more machine readable mediums, such as CD-ROMs or other type of optical disks, floppy diskettes, ROMs, RAMs, EPROMs, EEPROMs, magnetic or optical cards, flash memory, or other types of machine-readable mediums suitable for storing electronic instructions. Alternatively, the methods may be performed by a combination of hardware and software.

Specific details were given in the description to provide a thorough understanding of the embodiments. However, it will be understood by one of ordinary skill in the art that the embodiments may be practiced without these specific details. For example, circuits may be shown in block diagrams in order not to obscure the embodiments in unnecessary detail. In other instances, well-known circuits, processes, algorithms, structures, and techniques may be shown without unnecessary detail in order to avoid obscuring the embodiments.

Also, it is noted that the embodiments were described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed, but could have additional steps not included in the figure. A process may correspond to a method, a function, a procedure, a subroutine, a subprogram, etc. When a process corresponds to a function, its termination corresponds to a return of the function to the calling function or the main function.

Furthermore, embodiments may be implemented by hardware, software, firmware, middleware, microcode, hardware description languages, or any combination thereof. When implemented in software, firmware, middleware or microcode, the program code or code segments to perform the necessary tasks may be stored in a machine readable medium such as storage medium. A processor(s) may perform the necessary tasks. A code segment may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, etc.

While illustrative embodiments have been described in detail herein, it is to be understood that the inventive concepts may be otherwise variously embodied and employed, and that the appended claims are intended to be construed to include such variations, except as limited by the prior art.

What is claimed is:

1. A test system comprising a combination of:
    a test piece, including:
        a circuit board with an obverse and a reverse side, wherein the circuit board includes electrical connection pads and a mounting pad on the obverse side;
        a thermally-enhanced integrated circuit, wherein the thermally-enhanced integrated circuit includes at least one point electrically interconnected to at least one of the electrical connection pads of the circuit board; and
        a heat sink, wherein the heat sink is conductively connected to the thermally-enhanced integrated circuit and to the mounting pad of the circuit board, such that the heat sink is disposed between the thermally-enhanced integrated circuit and the circuit board;
    a manufacturing line configured to assemble and move the test piece; and
    a test area, wherein the manufacturing line is configured to move the test piece into the test area, the test area comprising:
        a power harness configured to at least one of electrically connect to the circuit board and provide a source of heat for transfer to the thermally-enhanced integrated circuit; and
        a thermal imaging camera with a field of view facing the reverse side of the circuit board of the test piece, and wherein the thermal imaging camera is disposed to produce a thermal image of the connection between the heat sink and the mounting pad, wherein the circuit board is between the thermal imaging camera and the heat sink.

2. The test system as defined in claim 1, further comprising a test system, the test system comprising:
    a memory;
    a processor in communication with the memory, the processor configured to execute:
        a power harness module configured to control the power harness;
        a manufacturing line module configured to control the manufacturing line;
        a thermal camera module configured to control the thermal imaging camera; and
        a test control module configured to control the power harness module, the manufacturing line module, and the thermal camera module.

3. The test system as defined in claim 2, wherein the test control module configured to:
    receive a test environment input that the test piece has entered the test area;
    command the power harness module to connect the power harness to the thermally-enhanced integrated circuit;
    wait until heat dissipation of the thermally-enhanced integrated circuit reaches a steady state;
    command the thermal camera module to operate the thermal imaging camera to image the thermally-enhanced integrated circuit to produce the thermal image; and
    determine, from the thermal image, if the thermally-enhanced integrated circuit is properly mounted to the circuit board.

4. The test system as defined in claim 2, wherein the test control module configured to determine a test scenario for the test piece, wherein the test scenario includes two or more tests.

5. The test system as defined in claim 2, wherein the test control module configured to:

determine if the thermal image has a predetermined number of image pixels within a predetermined color range;

determine if there are one or more voids within the thermal image where no color is shown;

if the thermal image does have the predetermined number of image pixels within the predetermined color range and if there are no voids within the thermal image where no color is shown, determine from the thermal image if the thermally-enhanced integrated circuit is properly mounted to the circuit board; and if the thermal image does not have the predetermined number of image pixels within the predetermined color range and if there are one or more voids within the thermal image where no color is shown, command the thermal camera module to adjust the thermal imaging camera.

6. The test system as defined in claim 2, wherein the test control module configured to:

if the thermally-enhanced integrated circuit is properly mounted to the circuit board, command the manufacturing line module to have the manufacturing line continue manufacturing the test piece; and if the thermally-enhanced integrated circuit is not properly mounted to the circuit board, command the manufacturing line module to have the manufacturing line rework the test niece.

7. The test system as defined in claim 2, wherein the test control module is configured to automatically determine if the thermally-enhanced integrated circuit is properly mounted to the circuit board, wherein to automatically determine if the thermally-enhanced integrated circuit is properly mounted to the circuit board, the test control module configured to:

determine if there are one or more indications of cold areas in the thermal image;

if there is not one or more indications of cold areas in the thermal image, determine that the thermally-enhanced integrated circuit is properly mounted to the circuit board;

if there are one or more indications of cold areas in the thermal image, determine a number of cold areas;

determine a size for each of the determined cold areas;

determine an intensity for each of the determined cold areas;

compare at least one of the number of cold areas, the size for each of the determined cold areas, and the intensity for each of the determined cold areas with one or more criteria; and from the comparison, determine if the thermally-enhanced integrated circuit is properly mounted to the circuit board.

* * * * *

UNITED STATES PATENT AND TRADEMARK OFFICE
CERTIFICATE OF CORRECTION

PATENT NO.       : 8,376,209 B2                                   Page 1 of 1
APPLICATION NO.  : 12/779848
DATED            : February 19, 2013
INVENTOR(S)      : Jae H. Choi et al.

It is certified that error appears in the above-identified patent and that said Letters Patent is hereby corrected as shown below:

In the Claims

Column 16, line 4, Claim 6, delete "niece" and insert --piece--.

Signed and Sealed this
Fourth Day of June, 2013

Teresa Stanek Rea
*Acting Director of the United States Patent and Trademark Office*